United States Patent
Liang

(10) Patent No.: US 7,216,275 B2
(45) Date of Patent: May 8, 2007

(54) METHOD AND APPARATUS FOR ACCESSING HIDDEN DATA IN A BOUNDARY SCAN TEST INTERFACE

(75) Inventor: Bor-Sung Liang, Kaohsiung (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 305 days.

(21) Appl. No.: 11/032,006

(22) Filed: Jan. 11, 2005

(65) Prior Publication Data
US 2005/0172190 A1   Aug. 4, 2005

(30) Foreign Application Priority Data
Jan. 16, 2004   (TW) ............... 93101269 A

(51) Int. Cl.
*G01R 31/28* (2006.01)
(52) U.S. Cl. .................................... 714/727
(58) Field of Classification Search ............ None
See application file for complete search history.

(56) References Cited

U.S. PATENT DOCUMENTS

| | | | |
|---|---|---|---|
| 5,659,508 A | | 8/1997 | Lamphier et al. |
| 5,768,196 A | * | 6/1998 | Bloker et al. ............. 365/200 |
| 5,898,704 A | * | 4/1999 | Kawano ..................... 714/727 |
| 6,052,808 A | | 4/2000 | Wu et al. |
| 6,073,254 A | | 6/2000 | Whetsel |
| 6,378,090 B1 | | 4/2002 | Bhattacharya |
| 7,047,467 B1 | * | 5/2006 | Khu et al. ................. 714/727 |

FOREIGN PATENT DOCUMENTS

EP   1089083   4/2001

* cited by examiner

*Primary Examiner*—Christine T. Tu
(74) *Attorney, Agent, or Firm*—Bacon & Thomas, PLLC

(57) ABSTRACT

An apparatus and method for accessing hidden data in a boundary scan test interface is disclosed, which defines an invalid state transition loop in a boundary scan test interface and initially monitors an input of state transition diagram of the boundary scan test interface so that an output of a first data is generated when a first predetermined input stream conforming to the invalid state transition loop is detected and next an output of a second data is generated when a second predetermined input stream conforming to the invalid state transition loop is detected, wherein when an input key included in a combination of the first and the second data is matched with a predetermined write key, a specific write data is loaded into a hidden register.

28 Claims, 6 Drawing Sheets

METHOD AND APPARATUS FOR ACCESSING HIDDEN DATA IN A BOUNDARY SCAN TEST INTERFACE

BACKGROUND OF THE INVENTION

1. Field of the Invention

The present invention relates to the technical field of boundary scan test interface and, more particularly, to an apparatus and method for accessing hidden data in a boundary scan test interface.

2. Description of Related Art

Since chip packages and multi-level printed circuit boards (PCBs) have become complicated more and more, the conventional in-circuit test using a bed-of-nail is not satisfactory as it is difficult to accurately contact the nodes on a PCB. In addition, due to the advance of surface mount technology (SMT), most ICs are mounted directly on the surface of a circuit board, which causes a problem that internal signals of the ICs cannot be tested directly. To overcome this, boundary scan technique has been developed. For example, the Joint Test Action Group (JTAG) boundary scan, formally known as IEEE-Std-1149.1, and IEEE1149.4 Digital Test Access Port interface, to define available boundary scan test interfaces for IC testing, which applies serial scan chain for testing the internal modules of an IC. FIG. 1 shows a block diagram of a typical JTAG interface. In FIG. 1, the JTAG interface uses five signal pins (TDI, TDO, TMS, TCK and nTRST) in scan chain data operation, i.e., TDI pin as a serial data input, TDO pin as a serial data output, TMS pin as a mode selection input, TCK pin as a clock input and nTRST pin as a system reset. As shown in FIG. 1, the JTAG interface includes a test access port (TAP) controller 11, a test data register 12, an instruction register 13 and a decoder 14.

The test data register 12 includes a scan chain register 121 as a scan chain to store serial data received by the TDI pin, an ID code register 122 storing special numbers to output, a bypass register 123 to directly forward the serial data from the TDI pin to the TDO pin for output.

The instruction register 13 stores a serial instruction received by the TDI pin. The decoder 14 decodes the serial instruction to thus control operations of the TAP controller 11.

The TAP controller 11 performs state transition based on the TMS pin's input and operates with the data of the register 12 and the outcome of the decoder 14. FIG. 2 is a state transition diagram of the TAP controller 11, where state transition occurs in sampling TMS signals at rising edges of a TCK signal output. As shown in FIG. 2, initially, the TAP controller 11 is at Test-Logic Reset state. Next, the controller 11 can enter states of idle process 21, data register process 22 and instruction register process 23. As TMS=1, the Test-Logic Reset state is unchanged, and when TMS=0, the state is transited to Run-Test/Idle state of the idle process 21. Next, the Run-Test/Idle state is unchanged as TMS=0, and transited to Select-DR-Scan state of the data register process 22 as TMS=1. In the Select-DR-Scan state, as TMS=0, the state is transited to Capture-DR state for processing of the register 12, and conversely, as TMS=1, the state is transited to Select-IR-Scan state of the instruction register process 23. In the Select-IR-Scan state, as TMS=0, the state is transited to Capture-IR state for processing of the register 13, and conversely, as TMS=1, the state is transited to the initial Test-Logic Reset state.

The aforementioned JTAG can transfer control signals or access registers through TDI and TDO pins for data read and write. However, data read and write through TDI and TDO pins are in sequential and can easily be detected. Thus, such secret register data cannot be protected. However, current processor development needs to protect equipment for development from steal by others. Therefore, it is desirable to provide an improved apparatus and method to mitigate and/or obviate the aforementioned problems.

SUMMARY OF THE INVENTION

An object of the invention is to provide an apparatus and method for accessing hidden data in a boundary scan test interface, which can read and write data without passing through standard data input/output pins, thereby achieving secure access for secret data in a boundary scan test interface.

Another object of the invention is to provide an apparatus and method for accessing hidden data in a boundary scan test interface, which can read and write secret data as compatible with the boundary scan test interface and does not impact completely on state and data paths of the boundary scan test interface.

According to a feature of the invention, an apparatus for accessing hidden data in a boundary scan test interface is provided. The boundary scan test interface operates with a predetermined state transition diagram to perform state transition based on an input, wherein the state transition performed includes at least one invalid state transition loop. The apparatus includes: a state detector for monitoring the input so as to output a first data when a first predetermined input stream is detected and then output a second data when a second predetermined input stream is detected, wherein the first and the second predetermined input streams are different and both conform to the invalid state transition loop; a shifter register for storing a combination of the first and the second data, wherein the combination has an input key; a hidden register for storing data; and a comparison device for comparing the input key with a predetermined write key and loading a specific write data into the hidden register when the input key equals to the predetermined write key.

According to another feature of the invention, a method for accessing hidden data in a boundary scan test interface is provided. The boundary scan test interface operates with a predetermined state transition diagram to perform state transition based on an input, wherein the state transition performed includes at least one invalid state transition loop. The method includes the steps: (A) monitoring the input so as to output a first data when a first predetermined input stream is detected and then to output of a second data when a second predetermined input stream is detected, wherein the first and the second predetermined input streams are different and both conform to the invalid state transition loop; (B) temporarily storing a combination of the first and the second data, wherein the combination has an input key; and (C) comparing the input key with a predetermined write key so that a specific write data is loaded into a hidden register when the input key equals to the predetermined write key.

Other objects, advantages, and novel features of the invention will become more apparent from the following detailed description when taken in conjunction with the accompanying drawings.

DETAILED DESCRIPTION OF THE PREFERRED EMBODIMENT

Figure 3:
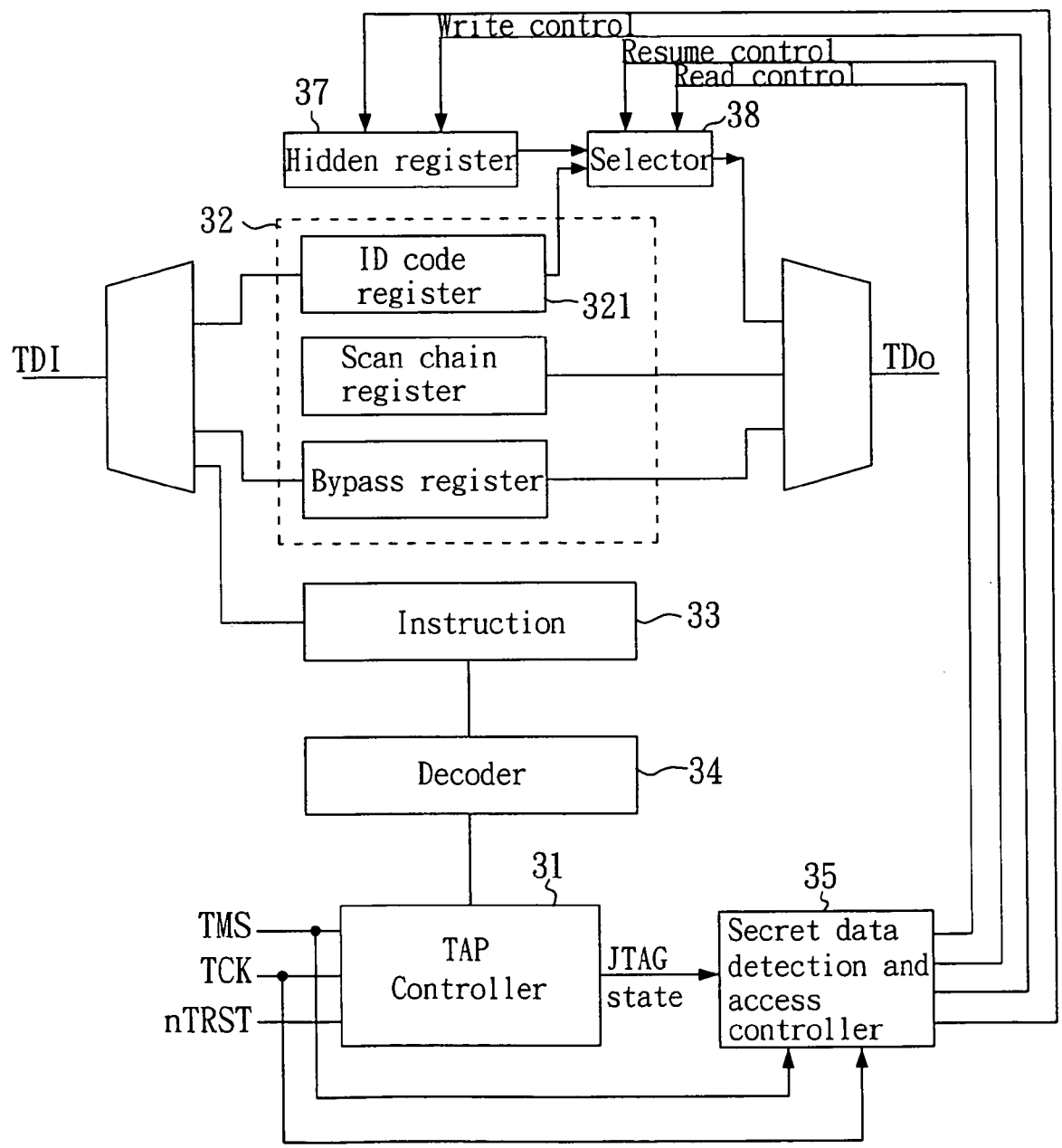
FIG. 3 is a block diagram of an apparatus and method for accessing hidden data in a boundary scan test interface according the invention.

FIG. 3 is a block diagram of an apparatus for accessing hidden data in a boundary scan test interface according the invention. In FIG. 3, the apparatus includes a TAP controller 31, a test data register 32, an instruction register 33, a decoder 34 a secret data detection and access controller 35, a hidden register 37 and a selector 38. The boundary scan test interface can be JTAG, IEEE1149.1, IEEE1149.4 or the like. In this embodiment, the boundary scan test interface applies a JTAG interface for exemplary description. Accordingly, the TAP controller 31, the test data register 32, the instruction register 33 and the decoder 34 are operated with the JTAG standard, which applies pins of serial data input (TDI), serial data output (TDO), mode selection input (TMS), clock input (TCK) and system reset (nTRST) to operate scan chain data. The selector 38 can select the content of ID code register 321 in the hidden register 37 or the test data register 32 for output. The secret data detection and access controller 35 can realize secret data read and write based on TMS input.

Figure 1:
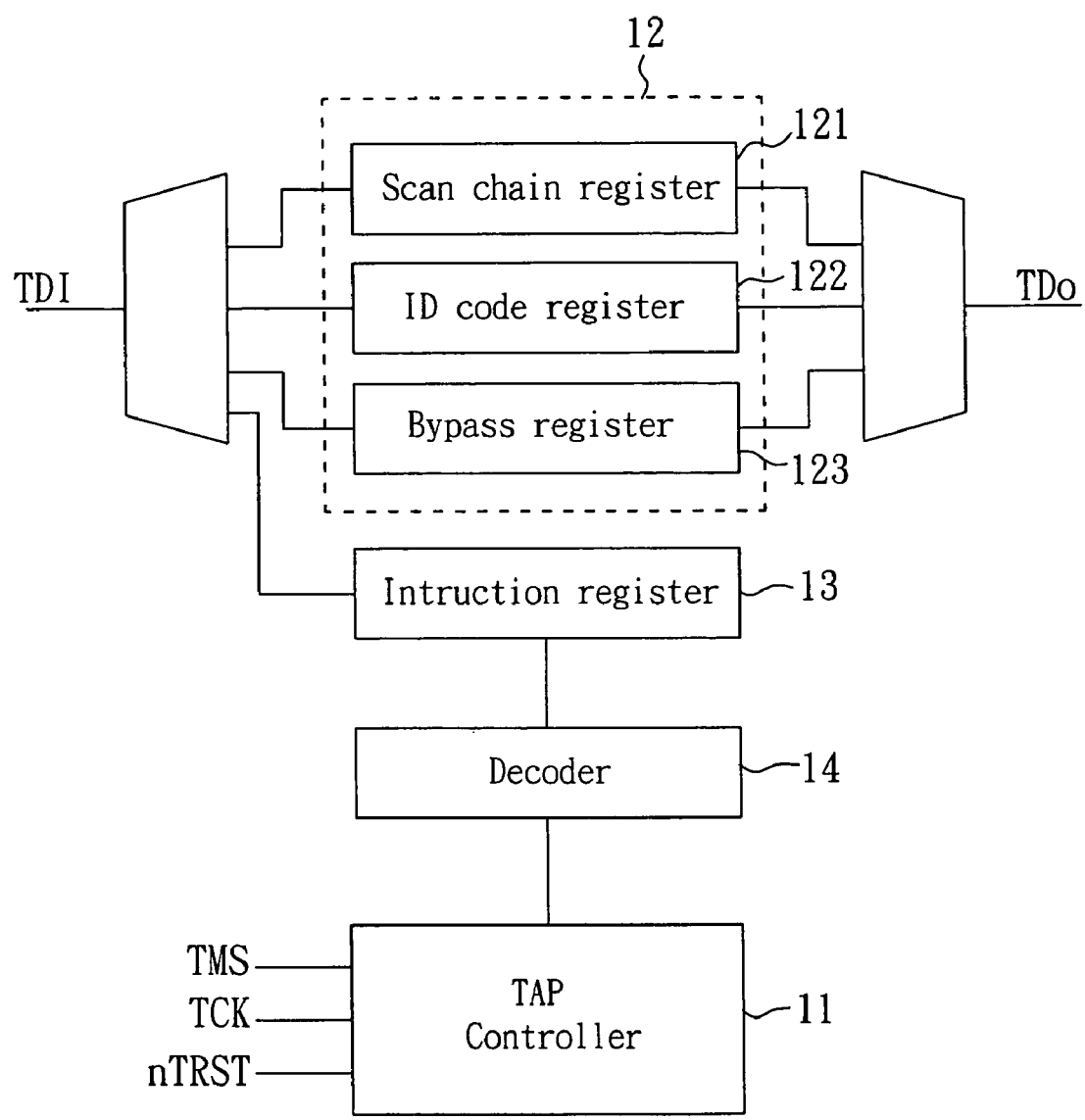
FIG. 1 is a block diagram of a typical JTAG interface.
Figure 2:
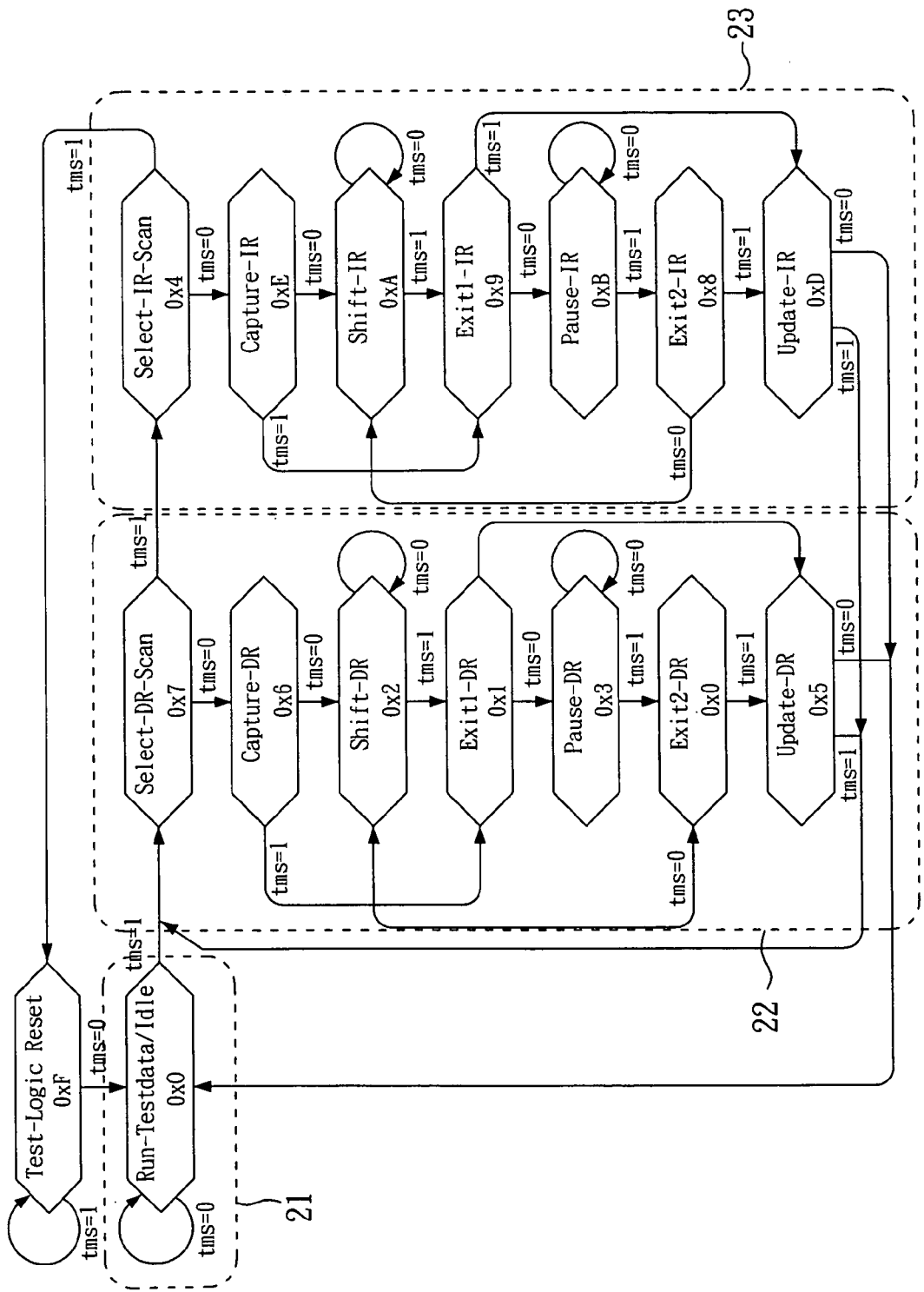
FIG. 2 is a state transition diagram of a TAP controller of FIG. 1.

Referring again to FIG. 2, the state transition diagram defined by the JTAG standard is initially at the Test-Logic Reset state. To make the JTAG interface inactive, an input of the TMS pin is at logic 1's (i.e., continuously inputting a sequence of '1') to stay at the Test-Logic Reset state. When desiring to activate the JTAG interface, the input of the TMS pin is changed to logic '0' for state transition. However, in order to avoid a '0' from accidentally occurring in a '1' sequence to thus activate the JTAG interface in mistake, state transition returns back to the initial Test-Logic Reset state through the Select-DR-Scan and Select-IR-Scan state if the input of the TMS pin remains at '1' after the Run-Test/Idle state is entered by inputting '0' to the TMS pin. Namely, an invalid state transition loop is substantially performed without entering any state that performs actual operation, thereby avoiding erroneous operation.

Figure 4:
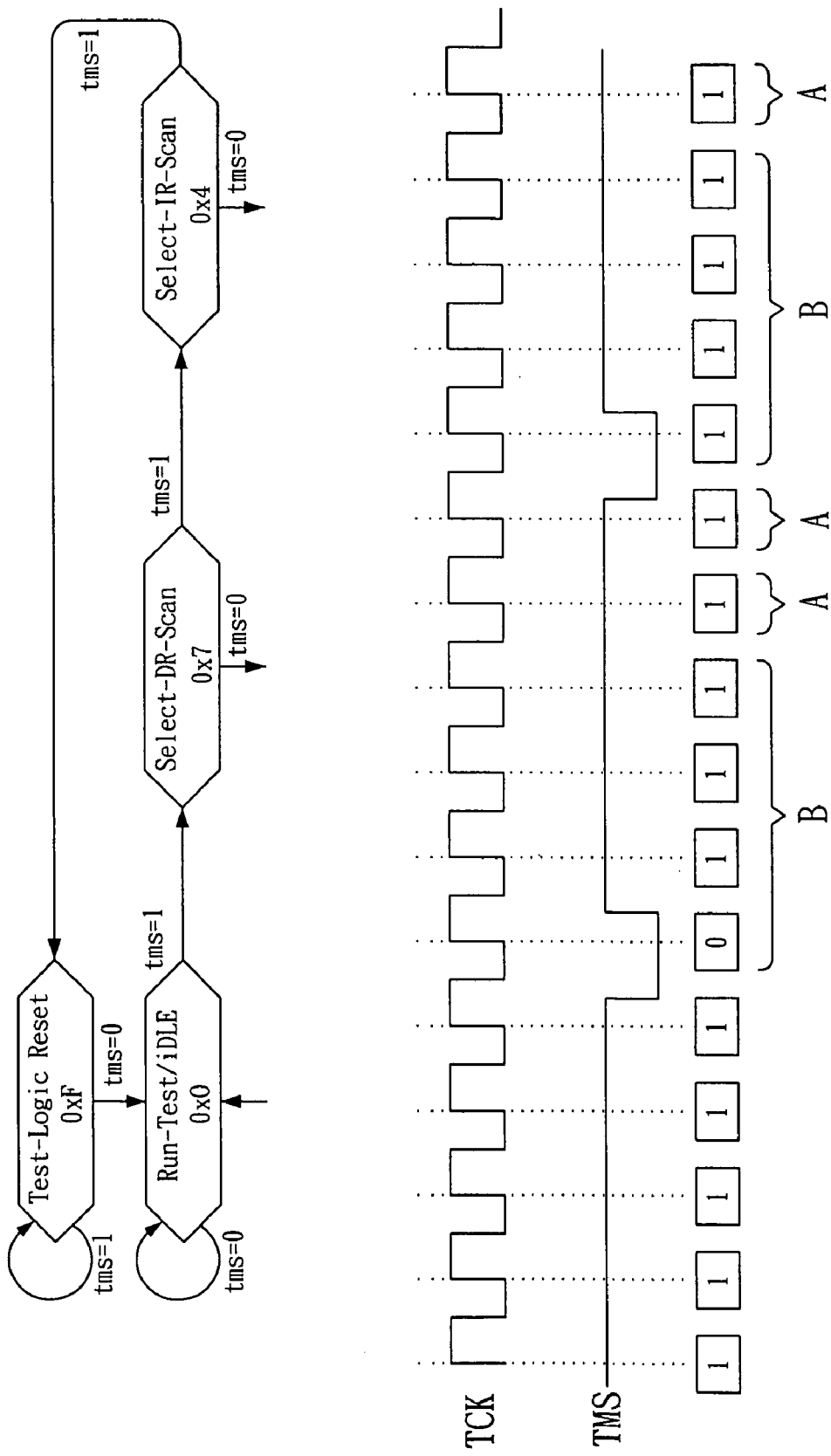
FIG. 4 is a flowchart of an invalid state transition loop in a state transition diagram of a TAP controller according to the invention.

FIG. 4 further shows the aforementioned invalid state transition loop. A TMS input stream that conforms to the invalid state transition loop will not cause any actual operation in the JTAG interface. Therefore, the invention defines at least two TMS input streams that conform to the invalid state transition loop, to represent two different input data A and B respectively. In this embodiment, A is '0' in binary and B is '1' in binary. As shown in FIG. 4, it is preferred to define a TMS input stream of '0111' as the input data B (=1) and the subsequent TMS input stream of '1' as the input data A (=0). In addition, since the Run-Testdata/Idle state is not changed as inputting '0', it is applicable to define a TMS input stream of '0̄0̄111' as the input data A or B, where 0̄ represents at least one '0'.

Figure 5:
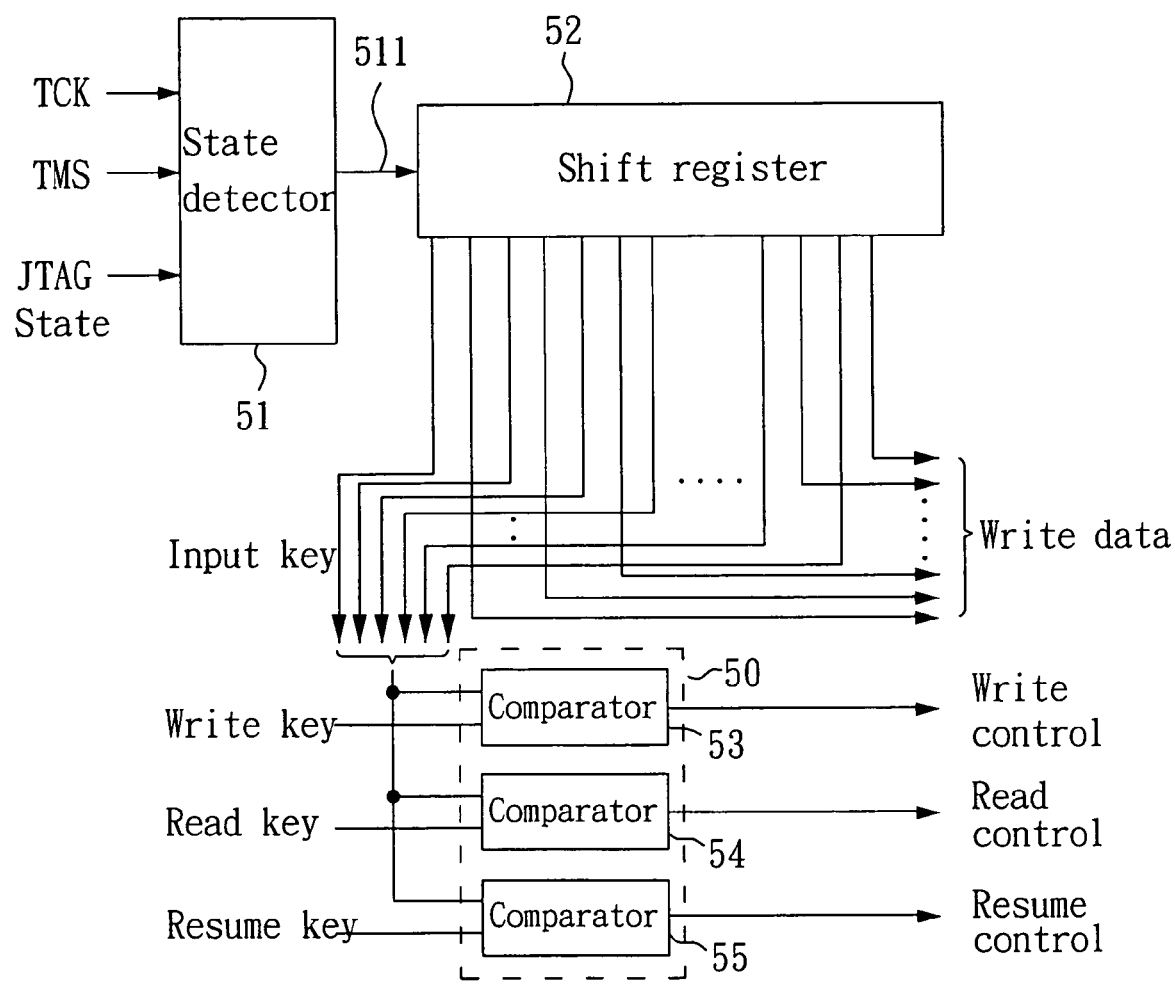
FIG. 5 is a block diagram of a secret data detection and access controller of FIG. 3 according to the invention.
Figure 6:
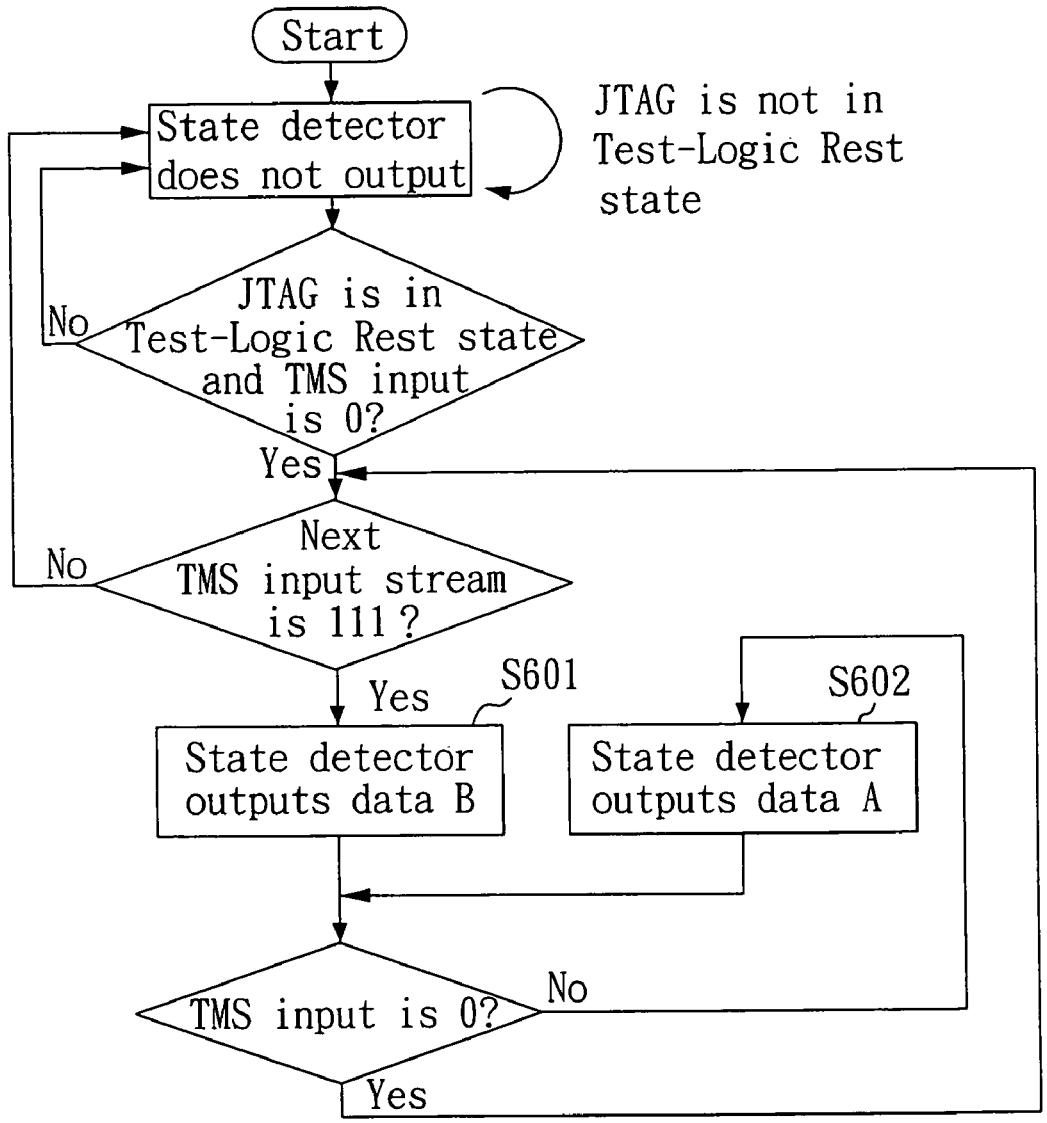
FIG. 6 is a flowchart of an operation of a state detector of FIG. 3 according to the invention.
Figure 6:
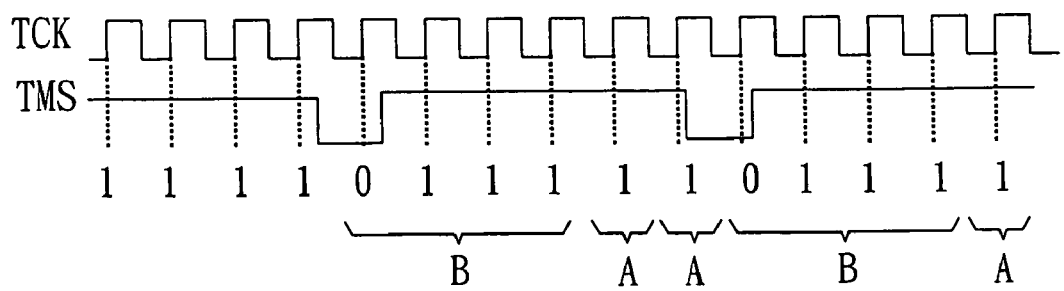

FIG. 5 shows a block diagram of the secret data detection and access controller 35 of FIG. 3. In FIG. 5, the secret data detection and access controller 35 includes a state detector 51, a shifter register 52 and a comparison device 50. The comparison device 50 has three comparators 53–55. The operation of the state detector 51 is shown in FIG. 6. As shown in FIG. 6, upon TCK input, TMS input, and JTAG state generated by the TAP controller 31, when the TAP controller 31 is determined as the Test-Logic Reset state, monitoring TMS input is started. When a TMS input stream of '0111' is detected, the data output 511 generates a data B (=1) for output (step S601). Next, when a TMS input stream of '1' is detected, the data output 511 generates a data A (=0) for output (step S602). Data from the data output 511 is sampled and stored in the shifter register 52 according to TCK signal. Therefore, desired data combination for input can be generated by the data output 511 of the state detector 51 by means of inputting appropriate combination of streams at the TMS pin. The data combination is stored temporarily in the shifter register 52.

A part of the data combination temporarily stored in the shifter register 52 is applied as an input key and the remainder can be applied as a write data. In this embodiment, the odd bits of the data combination are the input key and the even ones are the write data. The comparators 53–55 respectively compare the input key with a write key, a read key and a resume key. When the input key equals to the write key, the comparator 53 outputs a write control signal. When the input key equals to the read key, the comparator 54 outputs a read control signal. When the input key equals to the resume key, the comparator 55 outputs a resume control signal.

Referring also to FIG. 3, the write control signal is provided to set the hidden register 37 to load the write data. Therefore, when going to write a data in secret, an appropriate combination of streams is sent to the TMS pin as an input, thus the input key equal to the write key and the data are generated at the data output 511 of the state detector 51, thereby generating the write control signal to write the data in the hidden register 37.

The read control signal is provided to control the selector 38 to output current content of the hidden register 37. The resume control signal is provided to control the selector 38 to output current content of the ID code register 321. Accordingly, when going to read the content of the hidden register 37, an appropriate combination of streams is sent to the TMS pin as an input, thus the input key equal to the read key is generated at the data output 511 of the state detector 51, thereby generating the read control signal to control the selector 38 to output the content of the hidden register 37 through an output path of the ID code register 321 defined by the JTAG interface. When not reading the content of the hidden register 37, an appropriate combination of streams is sent to the TMS pin as an input, thus the input key equal to the resume key is generated at the data output 511 of the state detector 51, thereby generating the resume control signal to control the selector 38 to output the content of the ID code register 321. Namely, the output path of the ID code register 321 defined by the JTAG interface outputs the ID code register's content and thus restores the JTAG interface's status.

In view of the foregoing, it is known that the invention applies the invalid state transition loop in the state transition diagram of the boundary scan test interface to access hidden data without accessing data through the standard data input/output pins, thereby achieving protective access of secret data in the boundary scan test interface, which can be compatible completely with the boundary scan test interface and does not impact completely on states and data paths of the boundary scan test interface.

Although the present invention has been explained in relation to its preferred embodiment, it is to be understood that many other possible modifications and variations can be made without departing from the spirit and scope of the invention as hereinafter claimed.

What is claimed is:

1. An apparatus for accessing hidden data in a boundary scan test interface, the boundary scan test interface operating with a predetermined state transition diagram to perform state transition based on an input, wherein the state transition performed has at least one invalid state transition loop, the apparatus comprising:
    a state detector, for monitoring the input so as to output a first data when a first predetermined input stream is detected and then output a second data when a second predetermined input stream is detected, wherein the first and the second predetermined input streams are different and both conform to the invalid state transition loop;
    a shifter register, for storing a combination of the first and the second data, wherein the combination has an input key;
    a hidden register, for storing data; and
    a comparison device, for comparing the input key with a predetermined write key and loading a specific write data into the hidden register when the input key equals to the predetermined write key.

2. The apparatus as claimed in claim 1, wherein the combination further comprises information of the specific write data.

3. The apparatus as claimed in claim 2, further comprising: a selector for selecting a content of the hidden register or a specific register defined by the boundary scan test interface as an output.

4. The apparatus as claimed in claim 3, wherein the comparison device compares the input key with a predetermined read key and controls the selector to output the content of the hidden register when the input key equals to the predetermined read key.

5. The apparatus as claimed in claim 4, wherein the comparison device compares the input key with a predetermined resume key and controls the selector to output the content of the specific register when the input key equals to the predetermined resume key.

6. The apparatus as claimed in claim 2, wherein the input key is odd bits of the combination and the specific write data is even bits of the combination.

7. The apparatus as claimed in claim 2, wherein the boundary scan test interface is a JTAG interface and the input is a TMS input.

8. The apparatus as claimed in claim 2, wherein the boundary scan test interface is an IEEE 1149.1 interface and the input is a TMS input.

9. The apparatus as claimed in claim 2, wherein the boundary scan test interface is an IEEE 1149.4 Digital Test Access Port interface and the input is a TMS input.

10. The apparatus as claimed in claim 7, wherein the state transition diagram is initially at a Test-Logic Reset status, unchanged as the TMS input is '1', transited to a Run-Test/Idle status as the TMS input is '0', stayed at the Run-Test/Idle status as the TMS input is '0', and transited to the Test-Logic Reset state as the TMS input meets with three successive 1 s, so as to form the at least one invalid state transition loop.

11. The apparatus as claimed in claim 10, wherein the first predetermined input stream is '0111' and the second predetermined input stream is '1'.

12. The apparatus as claimed in claim 11, wherein the first data is '1' and the second data is '0'.

13. The apparatus as claimed in claim 10, wherein the first predetermined input stream is '0$\overline{0}$111' and the second predetermined input stream is '1', where $\overline{0}$ represents at least one '0'.

14. The apparatus as claimed in claim 13, wherein the first data is '1' and the second data is '0'.

15. The apparatus as claimed in claim 7, wherein data outputted by the state detector is sampled and stored in the shifter register according to a TCK signal defined by the JTAG.

16. The apparatus as claimed in claim 3, wherein the specific register is an identification (ID) code register.

17. A method for accessing hidden data in a boundary scan test interface, the boundary scan test interface operating with a predetermined state transition diagram to perform state transition based on an input, wherein the state transition performed has at least one invalid state transition loop, the method comprising the steps of:
    (A) monitoring the input so as to output a first data when a first predetermined input stream is detected and then to output of a second data when a second predetermined input stream is detected, wherein the first and the second predetermined input streams are different and both conform to the invalid state transition loop;
    (B) temporarily storing a combination of the first and the second data, wherein the combination has an input key; and
    (C) comparing the input key with a predetermined write key so that a specific write data is loaded into a hidden register when the input key equals to the predetermined write key.

18. The method as claimed in claim 17, wherein the combination further comprises information of the specific write data.

19. The method as claimed in claim 18, further comprising the step of:
    (D) comparing the input key with a predetermined read key, and outputting a content of the hidden register through an output path of a specific register defined by the boundary scan test interface when the input key equals to the predetermined read key.

20. The method as claimed in claim 19, further comprising the step of:
    (E) comparing the input key with a predetermined resume key, and outputting the content of the hidden register through the output path of the specific register defined by the boundary scan test interface.

21. The method as claimed in claim 18, wherein in step (B), the input key is odd bits of the combination and the specific write data is even bits of the combination.

22. The method as claimed in claim 18, wherein the boundary scan test interface uses a JTAG interface and the input is a TMS input.

23. The method as claimed in claim 18, wherein the boundary scan test interface uses an IEEE 1149.1 interface and the input is a TMS input.

24. The method as claimed in claim 18, wherein the boundary scan test interface uses an IEEE 1149.4 Digital Test Access Port interface and the input is a TMS input.

25. The method as claimed in claim 22, wherein the state transition diagram is initially at a Test-Logic Reset state, unchanged as the TMS input is '1', transited to a Run-Test/Idle state as the TMS input is '0', stayed at the Run-Test/Idle state as the TMS input is '0', and transited to the Test-Logic Reset state as the TMS input meets with three successive 1s, so as to form the at least one invalid state transition loop.

26. The method as claimed in claim 25, wherein in step (A), the first predetermined input stream is '0111' while the first data is '1'; the second predetermined input stream is '1' while the second data is '0'.

27. The method as claimed in claim 25, wherein in step (A), the first predetermined input stream is '0$\overline{0}$111' while the first data is '1', where $\overline{0}$ represents at least one '0'; the second predetermined input stream is '1' while the second data is '0'.

28. The method as claimed in claim 19, wherein the specific register is an ID code register.

* * * * *